United States Patent
Li

(10) Patent No.: US 7,804,289 B2
(45) Date of Patent: Sep. 28, 2010

(54) TESTING DEVICE INCLUDING LOW-PASS FILTER WITH AUTOMATICALLY SWITCHING FUNCTION

(75) Inventor: Chun-Liang Li, Jhongli (TW)

(73) Assignee: Cyrustek Co., Hsinchu (TW)

( * ) Notice: Subject to any disclaimer, the term of this patent is extended or adjusted under 35 U.S.C. 154(b) by 218 days.

(21) Appl. No.: 12/237,345

(22) Filed: Sep. 24, 2008

(65) Prior Publication Data

US 2009/0261809 A1 Oct. 22, 2009

(30) Foreign Application Priority Data

Apr. 17, 2008 (TW) .............................. 97113893 A

(51) Int. Cl.
*G01R 23/02* (2006.01)

(52) U.S. Cl. .................... 324/76.39; 324/115

(58) Field of Classification Search ................ 324/537, 324/76.11, 76.39, 114, 115
See application file for complete search history.

(56) References Cited

U.S. PATENT DOCUMENTS

| | | | |
|---|---|---|---|
| 4,001,697 A | 1/1977 | Withers et al. | |
| 4,164,624 A | 8/1979 | Ogita | |
| 4,789,824 A | 12/1988 | Henkelmann | |
| 5,446,371 A | 8/1995 | Eccleston et al. | |
| 5,473,244 A | 12/1995 | Libove et al. | |
| 5,530,373 A | 6/1996 | Gibson et al. | |
| 5,698,984 A | 12/1997 | Little et al. | |
| 5,930,745 A | 7/1999 | Swift | |
| 6,043,640 A | 3/2000 | Lauby et al. | |
| 6,094,045 A | 7/2000 | Zoellick | |
| 6,392,402 B1 | 5/2002 | Swift | |
| 6,731,102 B2 | 5/2004 | Gregorec, Jr. et al. | |
| 6,794,859 B2 | 9/2004 | Choi | |
| 6,856,138 B2 | 2/2005 | Bohley | |
| 6,919,729 B2 | 7/2005 | Tiefnig | |
| 7,034,517 B2 | 4/2006 | Newcombe | |
| 7,072,804 B2 | 7/2006 | Weller | |
| 7,342,393 B2 | 3/2008 | Newcombe | |

*Primary Examiner*—Vincent Q Nguyen
(74) *Attorney, Agent, or Firm*—Ming Chow; Sinorica, LLC

(57) ABSTRACT

A testing device including low-pass filter with automatically switching function is disclosed in the present invention, comprising: a control circuit used to control the operation of the testing device and provide a reference frequency (Fr); a frequency detection circuit, connected to the input end and the control circuit and used to output a high frequency control signal; a low-pass filter connected to the frequency detection circuit, used to filter the testing signal of the input end to output a frequency signal; a frequency evaluation circuit connected to the control circuit and to the frequency signal outputted from the low-pass filter, the frequency evaluation circuit outputting a medium frequency control signal to the low-pass filter and outputting a frequency testing value to a display at the same time; and a voltage measuring circuit, connected to the low-pass filter and the control circuit and used to output a voltage measuring value to the display.

6 Claims, 6 Drawing Sheets

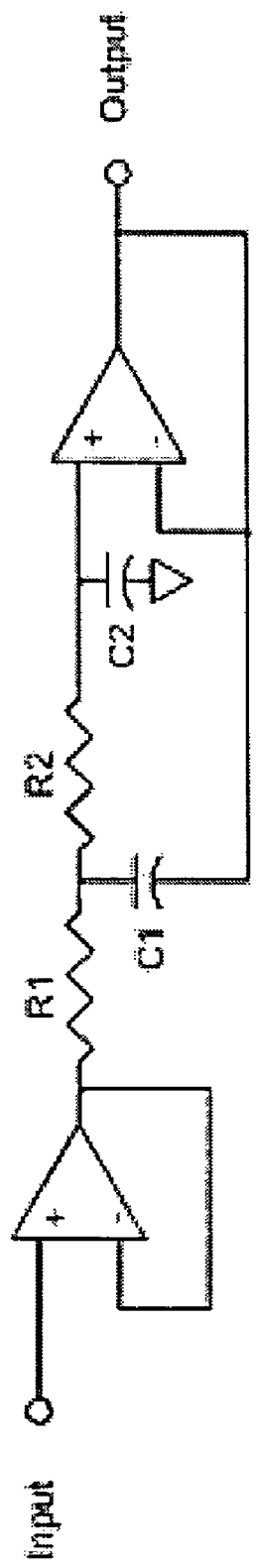
Fig 7 (PriorArt)

TESTING DEVICE INCLUDING LOW-PASS FILTER WITH AUTOMATICALLY SWITCHING FUNCTION

BACKGROUND OF THE INVENTION

1. Field of the Invention

The present invention is related to an electrical testing device and its testing method, and more particularly, to a low-pass filter with automatically switching function used in the multi-meter.

2. Description of the Prior Art

The conventional low frequency signal is often transmitted with noise. For example, when testing mains power, the frequency of mains power is mostly low frequency signal at 50 Hz or 60 Hz, which is itself easy to be interrupted and often transmitted with noise. The noise will affect the evaluating result of the true RMS and cause error of voltage measuring value. In addition, take an advanced multi-meter for example, AC voltage can be measured at the same time when the frequency of the signal is evaluated. However, if the amplitude of the noise is too large, the Schmitt trigger will generate too many pulses, and the frequency evaluating result will be too high.

Therefore, in order to filter the high frequency noise, a low-pass filter is usually used for filtering the high frequency noise. But when a low-pass filter is used, if the input signal is itself a high frequency signal, the amplitude of the input signal will be attenuated, or even completely filtered, by the low-pass filter. In other words, when the frequency of input signal itself is as high as being close to the −3 db frequency of the low-pass filter, the amplitude of the filtered signal will start attenuating. And the higher the frequency, the more serious the attenuating problem is. Therefore, if the low-pass filter is directly utilized in the testing device for filtering, the low-pass filter will efficiently filter out the noise in the low frequency signal; however, when the testing signal is a high frequency signal (i.e. not a high frequency noise), the attenuation of the amplitude of the high frequency signal will cause lower testing value and thus mislead the user. For example, if the −3 db frequency of the low-pass filter is 1 KHz and the testing signal at the input end is a 10 KHz/300 V high frequency signal, a signal with frequency obviously higher than the −3 db frequency of the low-pass filter, the amplitude of the signal will be attenuated and the testing value will be very low and may lead to disregard of user and thus risk of electric injury. Moreover, take the advanced multi-meter for example, usually when the voltage value or the current value of the testing signal is detected as larger than the preset value, the buzzer of the multi-meter will buzz to alarm the user. Yet if the low-pass filter is operating in the multi-meter and causing the testing result much lower than its real value, the buzzer will lose its alarming function. In addition, if the attenuation of the signal is too serious, the Schmitt trigger is not able to generate pulses and the frequency is not able to be evaluated normally.

A method of manually activating low-pass filter is disclosed in U.S. Pat. No. 7,034,517 B2. The user has to determine whether to turn on the low-pass filter or not and push the button on the testing device to turn it on. However, when the user turns on the low-pass filter and the frequency of the testing signal becomes high frequency later on, error of testing result may also happen without being noticed by the user.

In order to filter the high frequency noise and maintain the accuracy of the testing result of the high frequency signal at the same time, an automatically switching function is disclosed in the present invention. The low-pass filter can be switched on and off according to different status of the signal at the input end to enhance the accuracy and the expediency of testing.

In the initial status, the low-pass filter is activated and the switches are used to select modes for evaluation within the testing device. When the frequency of the input signal is detected after operation to be close to or higher than the −3 db frequency of the low-pass filter, the −3 db frequency of the low-pass filter will automatically increase. If the input signal is detected as a high frequency signal, the low-pass filter will automatically turn off and the signal without being filtered is selected to be evaluated, and thus the accuracy and the expediency of testing will be enhanced.

SUMMARY OF THE INVENTION

As described above, the present invention discloses a testing device provided with a low-pass filter with automatically switching function. With a frequency detection circuit and a frequency evaluation circuit, the frequency of the testing signal can be detected. One objective of the present invention is thus to provide a low-pass filter with automatically switching function to be utilized in a testing device to avoid erroneous value being evaluated.

Another objective of the present invention is to provide a low-pass filter with automatically switching function to be utilized in a testing device to enhance the accuracy and the expediency of testing.

According to the objectives described above, the present invention first discloses a testing device including a low-pass filter with an automatically switching function, comprising a control circuit used to control the operation of the testing device and provide a reference frequency (Fr); a frequency detection circuit, connected to the input end and the control circuit and used to output a high frequency control signal; a low-pass filter connected to the frequency detection circuit, used to filter the testing signal of the input end to output a frequency signal; a frequency evaluation circuit connected to the control circuit and to the frequency signal outputted from the low-pass filter, the frequency evaluation circuit outputting a medium frequency control signal (MF) to the low-pass filter and outputting a frequency testing value to a display at the same time; and a voltage measuring circuit, connected to the low-pass filter and the control circuit and used to output a voltage measuring value to the display.

According to the objectives described above, the present invention further discloses a low-pass filter circuit, comprising: a first operational amplifier, a second operational amplifier, a first capacitor, a second capacitor, and a plurality of resistors, wherein a positive end of the first operational amplifier is connected to an input end, the characteristic of the low-pass filter in that: the first operational amplifier connecting to the first capacitor by a first switch, wherein an input end of the first switch is disposed with a plurality of switching positions, and the plurality of switching positions and the plurality of resistors with different resistant values connect to a negative input end of the first operational amplifier and an output end of the first operational amplifier, and a first end of the first capacitor connects to an output end of the first switch; the second operational amplifier connecting to the first capacitor by a second switch, wherein an input end of the second switch is disposed with a plurality of switching positions, and the plurality of switching positions and the plurality of resistors with different resistant values connect to the output end of the first switch, and the output end of the second switch connects to the second capacitor and the positive input end of the second operational amplifier, and the output end of the second operational amplifier connects to another end of the first capacitor and the negative input end of the second operational amplifier.

The present invention then provides an automatically switching method of low-pass filter disposed in testing device, comprising: providing a testing signal, inputted from the input end of the testing device; providing a control circuit for controlling the operation of the testing device and providing a reference frequency (Fr); providing a frequency detection circuit for being connected to the input end of testing device and the control circuit and for outputting a high frequency control signal (HF); providing a low-pass filter for being connected to the input end of the testing device and outputting a frequency signal after filtering the testing signal at the input end, the low-pass filter being connected to the frequency detection circuit and a frequency switching circuit being disposed in the low-pass filter at the same time; providing a frequency evaluation circuit for being connected to the control circuit and the frequency signal outputted by the low-pass filter, the frequency evaluation circuit outputting a medium frequency control signal (MF) to the low-pass filter at the same time; providing a voltage measuring circuit for being connected to the low-pass filter and the control circuit; wherein when the testing signal is evaluated as a high frequency signal by the frequency detection circuit, the frequency detection circuit will output a HF control signal to switch off the low-pass filter, the unfiltered high frequency signal being transmitted respectively to the voltage measuring circuit for performing voltage measuring and to the frequency evaluation circuit for performing frequency evaluation at the same time, the voltage measuring and frequency testing values of this high frequency signal being shown on the display in the end; or when the testing signal is a low frequency signal, after this low frequency signal is transmitted to the low-pass filter and the frequency evaluation circuit and the voltage measuring circuit, the voltage measuring and frequency testing values of this low frequency signal are shown on the display; or when the testing signal is one between low frequency signal and high frequency signal, the testing signal is transmitted to the low-pass filter and under the operation of the frequency evaluation circuit, the frequency evaluation circuit will output a MF control signal to the low-pass filter to drive the frequency switch circuit to get a higher −3 db frequency, and the testing values of this testing signal are shown on the display after the filtered signal is transmitted to the frequency evaluation circuit and the voltage measuring circuit.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 7 is a view of a conventional low-pass filter circuit.

DESCRIPTION OF THE PREFERRED EMBODIMENT

The present invention is about an electrical testing device, such as an advanced multi-meter, and more particularly, an electrical testing device including a low-pass filter with automatically switching on/off function. The detailed description of the present invention will be discussed in the following embodiments, which are not intended to limit the scope of the present invention, but can be adapted for other applications. While drawings are illustrated in details, it is appreciated that the quantity of the disclosed components may be greater or less than that disclosed, except expressly restricting the amount of the components.

Figure 1:
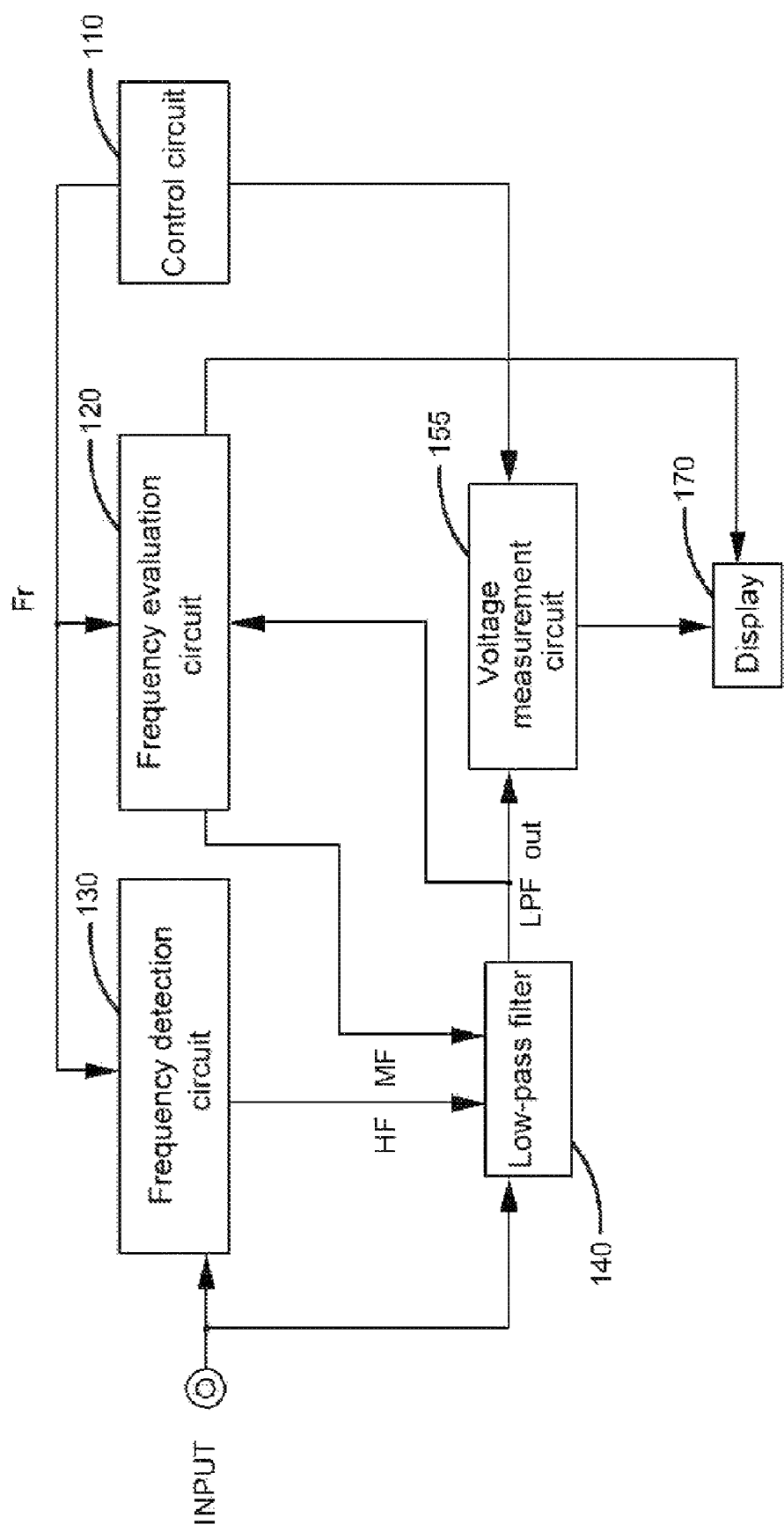
FIG. 1 is a block diagram illustrating a circuit of the present invention.

FIG. 1 is a block diagram of a testing device of the present invention with a low-pass filter with automatically switching function. As shown in FIG. 1, the testing device includes a control circuit 110 used to control the overall operation of the testing device and provide a reference frequency (Fr) to a frequency detection circuit 130, the frequency detection circuit 130 connecting to the input end and the control circuit 110 and outputting a high frequency control signal (HF); a low-pass filter 140, being disposed with a frequency switching circuit (not shown in FIG. 1) and filtering the testing signal of the input end to output a frequency signal, the low-pass filter 140 connecting to the frequency detection circuit 130; a frequency evaluation circuit 120, being connected to the control circuit 110 and the frequency signal outputted from the low-pass filter 140 and outputting a medium frequency control signal (MF) to the low-pass filter 140 and outputting a frequency testing value to a display 170; a voltage measuring circuit 155, being connected to the low-pass filter 140 and the control circuit 110 and outputting the voltage measuring value to the display 170.

Referring to the testing device shown in FIG. 1, when the testing signal at the input end is a low frequency signal, the low frequency signal will be transmitted to the low-pass filter 140 and the signal is filtered and transmitted respectively to the frequency evaluation circuit 120 and the voltage measuring circuit 155. The frequency value and the voltage value of the low frequency signal are then transmitted to the display 170 for being shown. When the testing signal at the input end is evaluated by the frequency detection circuit 130 as a high frequency signal, the low-pass filter 140 will be switched off by the high frequency control signal outputted by frequency detection circuit 130 and the unfiltered signal will be selected by the switch SW2 and transmitted respectively to the frequency evaluation circuit 120 and the voltage measuring circuit 155. The frequency value and the voltage value of the high frequency signal will be shown on the display 170. When the testing signal's frequency at the input end is between low frequency signal and high frequency signal, the testing signal will be transmitted to the low-pass filter 140 and undergo operation of the frequency evaluation circuit 120, and the frequency evaluation circuit 120 will output a medium frequency (MF) control signal to the low-pass filter 140. At this period, the low-pass filter 140 will drive the frequency switching circuit to get a higher −3 db frequency to prevent the input signal from being attenuated. The filtered signal will then be transmitted to the frequency evaluation circuit 120 and the voltage measuring circuit 155, and the frequency value and the voltage value of the testing signal are shown on the display 170.

Figure 2:
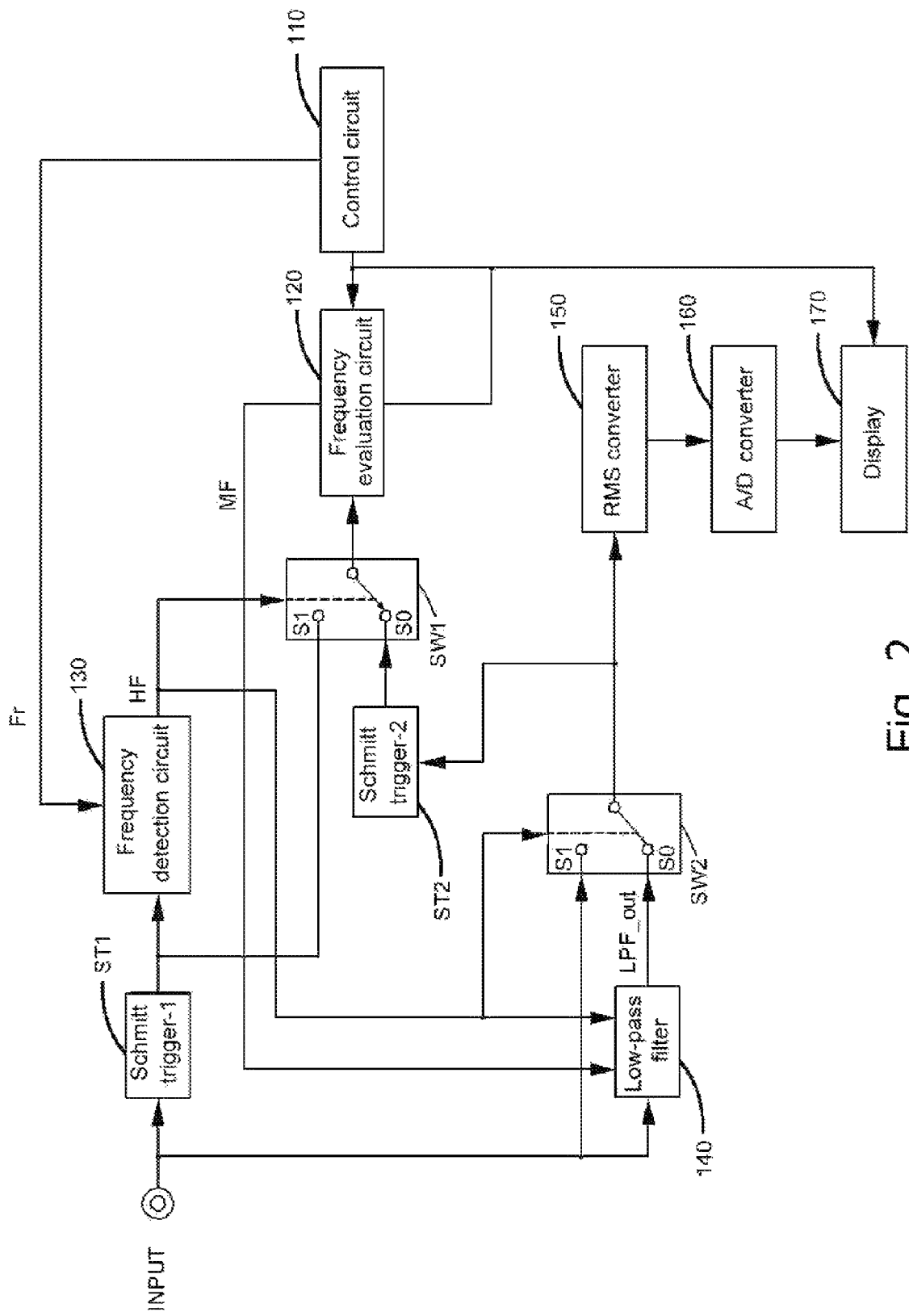
FIG. 2 is a view of circuit of a low-pass filter of the present invention with automatically switching on/off function.

Then referring to FIG. 2, which is a view showing circuit of the low-pass filter of the present invention with automatically switching on/off function. As shown in FIG. 2, the low-pass filter circuit includes: a control circuit 110, a low-pass filter 140, at least one Schmitt trigger, at least one switch, a frequency detection circuit 130, a frequency evaluation circuit 120, a RMS converter 150, an A/D converter 160, and a display 170. The control circuit 110 is used to control the operation of the whole system and output a reference signal (Fr). The frequency detection circuit 130 connects to the input end and the control circuit 110 and is used to detect whether the signal frequency is high or low in order to control the switch according to the detected result. The frequency evaluation circuit 120 connects to the control circuit 110 and is used to calculate the frequency value (high or low) so as to control the switching of −3 db frequency of the low-pass filter 140 according to the frequency value calculated. The Schmitt triggers (ST1, ST2) are used to convert the input signal into the square wave. The switches (SW1, SW2) connect to the frequency detection circuit 130 and are used to switch the transmitted path of the signal. The RMS converter 150 is used to convert the input signal into true RMS value. The A/D converter 160 is used to convert the analog signal of the input end into digital signal, which is evaluated to be digital value in order to be shown as testing value on the display 170.

As shown in FIG. 2, the testing device is able to test the voltage and the frequency of the testing signal at the same time. At first, before the testing device starts testing, the switch SW1 and the switch SW2 will be pre-set at S0 position. When a testing signal is inputted from the input end, the testing signal first enters the low-pass filter 140, then transmitted to the switch SW2, and is then converted by the RMS converter 150 into a true value. The testing signal is converted into a voltage value by the A/D converter 160 and the voltage value is transmitted to the display 170.

When the voltage of the testing signal is under testing, the frequency of the testing signal is also tested at the same time. When the testing signal is a low frequency signal (ex: 10 Hz) and enters from the input end, the testing signal first enters the low-pass filter 140 and is then transmitted to the SW2. Then, the testing signal is converted into a square wave by the Schmitt trigger ST2. The square wave signal is transmitted from the SW1 to the frequency evaluation circuit 120 and then the frequency value after evaluation is transmitted to the display 170.

Then, referring to FIG. 7, which shows a conventional low-pass filter circuit in the prior art. The low-pass filter is composed of two operational amplifiers (OP), two resistors (R1, R2), and two capacitors. Obviously, when values of the two resistors (R1, R2) are changed, the −3 db frequency of the low-pass filter can be adjusted. When the values of the resistors are smaller, the −3 db frequency of the low-pass filter will be higher.

Figure 3:
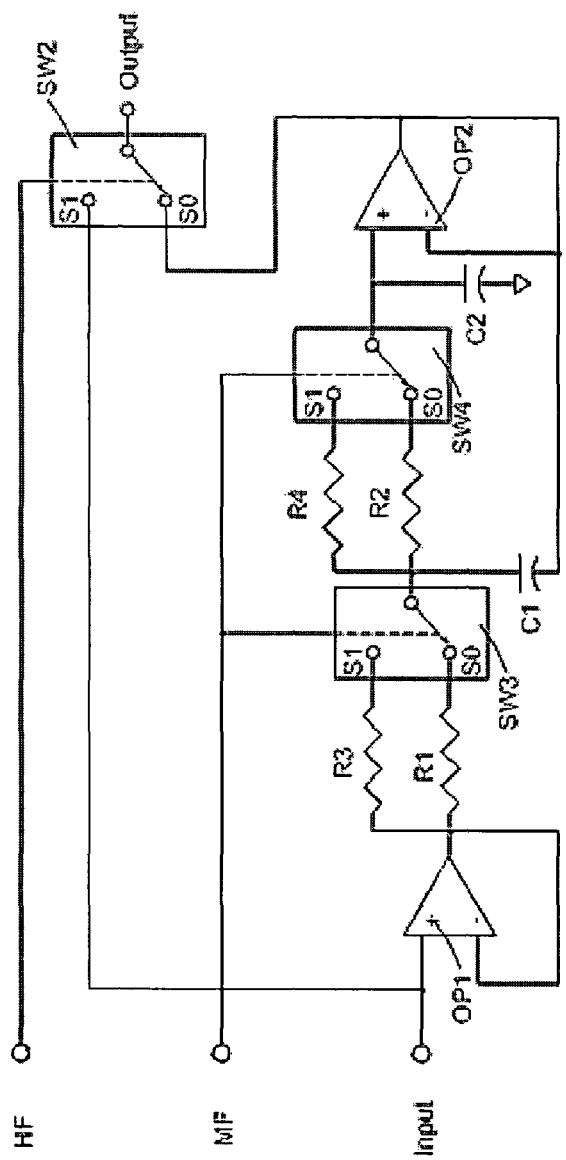
FIG. 3 is a view of an embodiment of circuit of low-pass filter of the present invention.

Referring to FIG. 3, which shows an embodiment of low-pass filter 140 of the present invention. The low-pass filter is like the low-pass filter of prior art as shown in FIG. 7, but added with two more resistors (R3, R4) and two switches (SW3, SW4), wherein R3 value is smaller than R1 value and R4 smaller than R2.

As shown in FIG. 3, the low-pass filter circuit 140 of the present invention includes a first operational amplifier OP1, a second operational amplifier OP2, a first capacitor C1, a second capacitor C2, and a plurality of resistors (Rn; n=1, 2, 3, 4 . . . ). Wherein the positive input end of the first operational amplifier OP1 connects to an input end, and the first operational amplifier OP1 is connected to the first capacitor C1 by a first switch SW3. The input end of the first switch SW3 is disposed with a plurality of switching positions (S0, S1), and the plurality of switching positions and the plurality of resistors with different resistor values are connected to the negative input end of the first operational amplifier OP1 and the output end of the first operational amplifier OP1. The first end of the first capacitor C1 connects to the output end of the first switch SW3. The second operational amplifier OP2 is connected to the first capacitor C1 by the second switch SW4. The input end of the second switch SW4 is disposed with a plurality of switching positions (S0, S1), and the plurality of switching positions and the plurality of resistors with different resistor values are connected to the output end of the first switch SW3. The output end of the second switch SW4 connects to the second capacitor C2 and the positive input end of the second operational amplifier OP2. The output end of the second operational amplifier OP2 connects to another end of the first capacitor C1 and the negative input end of the second operational amplifier OP2 itself. Besides, the two switches (SW3, SW4) are controlled by the medium frequency (MF). When the medium frequency is Low, the two switches (SW3, SW4) remain at the initial condition, i.e. the two switches are in S0 position, and the low-pass filter 140 outputs a −3 db frequency defined as $\omega 0$; when the medium frequency is High, the two switches (SW3, SW4) are switched to S1 position, and the low-pass filter 140 outputs a −3 db frequency defined as $\omega 1$. Obviously, because R3 is smaller than R1 and R4 is smaller than R2, the −3 db frequency $\omega 1$ is larger than −3 db frequency $\omega 0$.

Because the circuit of low-pass filter 140 will attenuate or completely filter the high frequency noise (including high frequency testing signal itself), therefore, when a high frequency testing signal (including high frequency noise and high frequency testing signal) is inputted from the input end as shown in FIG. 2, the testing signal will be first transmitted to the low-pass filter 140 and at this time, the pulse of the output end of the low-pass filter (LPF_out) is already attenuated, wherein the attenuated signal is transmitted to the S0 end of the switch SW2. On the other hand, as the pulse of the output end of the low-pass filter (LPF_out) is already attenuated, the Schmitt trigger ST2 is not able to convert the input signal into a square wave signal when the attenuation is critical. At the same time, the S0 end of the switch SW1 cannot receive normal square wave signal, and the frequency evaluation circuit is not able to operate or evaluate a wrong frequency value and then send the wrong frequency value to be shown on the display 170. In addition, because the signal received by the RMS converter 150 is an attenuated signal, thus the value converted by the A/D converter 160 is a lower value, which is also sent to the display 170. Obviously, the frequency testing value shown is an erroneous one and the voltage value is too low, which misleads the user to think that the signal from the input end is a low voltage signal.

During the frequency testing process, the frequency evaluation circuit 120 will keep evaluating the frequency of the testing signal, and the frequency detection circuit 130 will continue to test whether the frequency of the testing signal is high or low (the testing signal already being transmitted to the Schmitt trigger ST1 for the input signal to be converted into square wave signal at the time) to determine whether the test signal is a high frequency signal or a low frequency signal.

Figure 4:
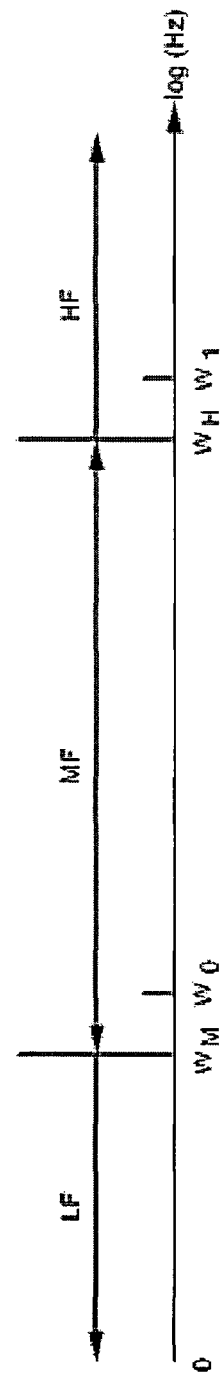
FIG. 4 is a view of the relative relationship among the low frequency (LF), the medium frequency (MF), the high frequency (HF), and the −3 db frequency outputted by the low-pass filter as determined in the present invention.

Referring to FIG. 4, which shows the relative relationship among the medium frequency (MF), the high frequency (HF), and $\omega 0$ and $\omega 1$ as defined in the present invention and $\omega 0 < \omega M < \omega H < \omega 1$. When the frequency is between $\omega M$ and ωH, the frequency is defined as a medium frequency (MF). When the frequency is higher than ωH, the frequency is defined as a high frequency (HF). When the frequency of the input signal is evaluated by the frequency evaluation circuit 120 to be higher than ωM, the medium frequency control signal, MF, will be changed to High. Thus the two switches (SW3, SW4) shown in FIG. 3 will be switched to S1 position, and the −3 db frequency outputted by the low-pass filter 140 will be changed from ω0 to ω1. Because the frequency value of ω1 is higher than the frequency value of ωH, obviously, with the low-pass filter 140 of the present invention being utilized, attenuation of signal in the medium frequency range can be avoided. When the frequency detection circuit 130 detects that frequency of an input signal is higher than ωH, the high frequency control signal, HF, will be changed to High, and it will make the switches SW1 and SW2 switch to S1 position. Meantime, the testing signal is transmitted to the frequency evaluation circuit 120 and the RMS converter 150 respectively through S1 position of the switches SW1 and SW2. The frequency tested and the voltage measured will be shown on the display 170. Obviously, during the testing procedure of the high frequency input signal, by switching the switch SW1 and SW2, the unfiltered high frequency signal is transmitted to the RMS converter 150 directly. Therefore, the problem of error when testing caused by attenuation of the high frequency signal can be avoided, and the frequency evaluation circuit 120 can also operate normally. At this moment, the low-pass filter 140 can be turned off by the controller 110 to reduce electricity consumption. When the frequency detection circuit 130 detects the input signal to be a low frequency signal, the switches SW1 and SW2 will be immediately switched back to S0 position, and the low-pass filter 140 will be re-started by the controller 100. Therefore, the circuit of low-pass filter 140 as disclosed in the present invention can switch automatically according to the frequency range of the testing signal, which allows accuracy and expediency of testing to be enhanced and the electricity consumption to be reduced.

Figure 5:
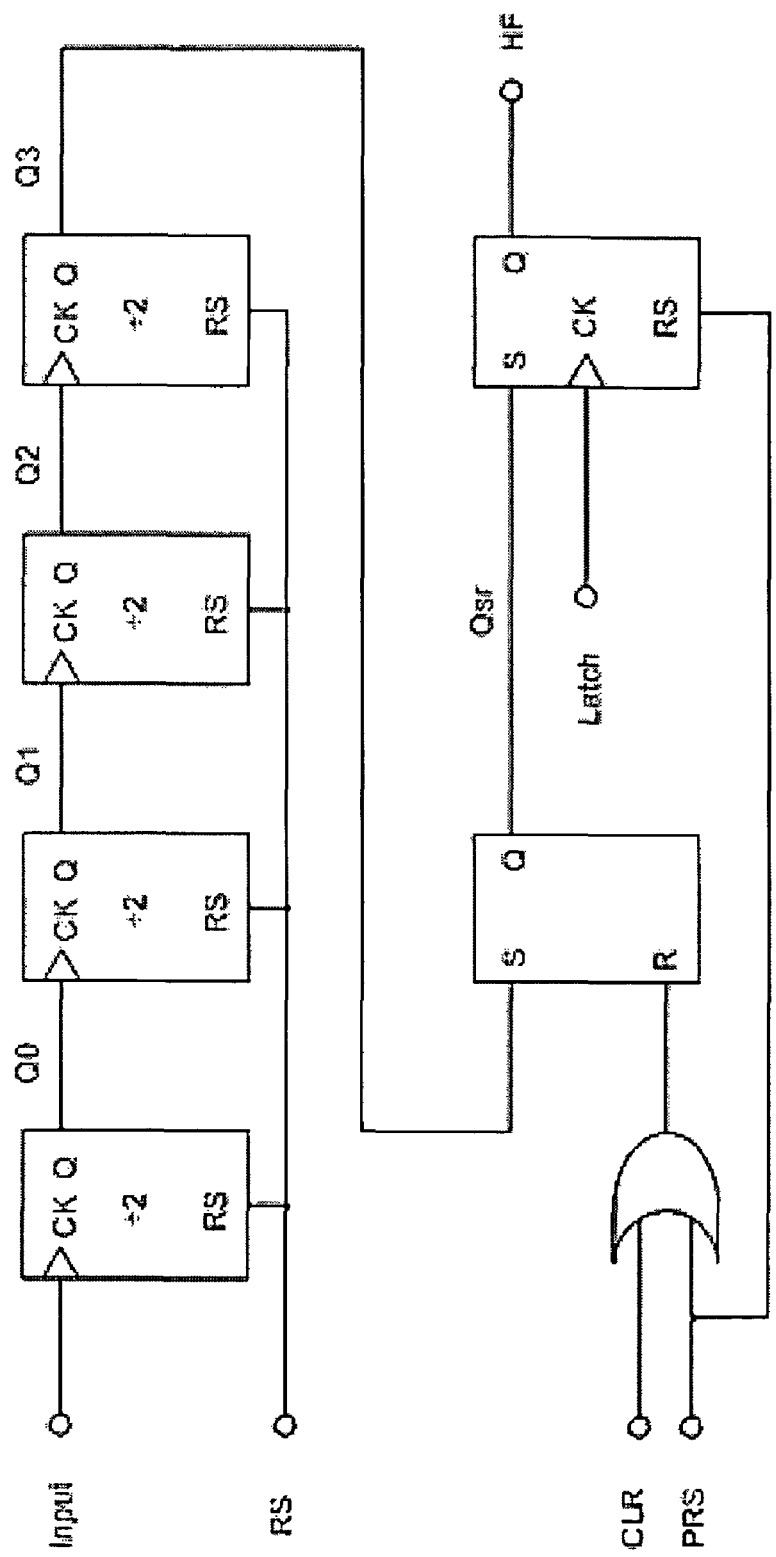
FIG. 5 is a view of an embodiment of frequency detection circuit of the present invention.
Figure 6:
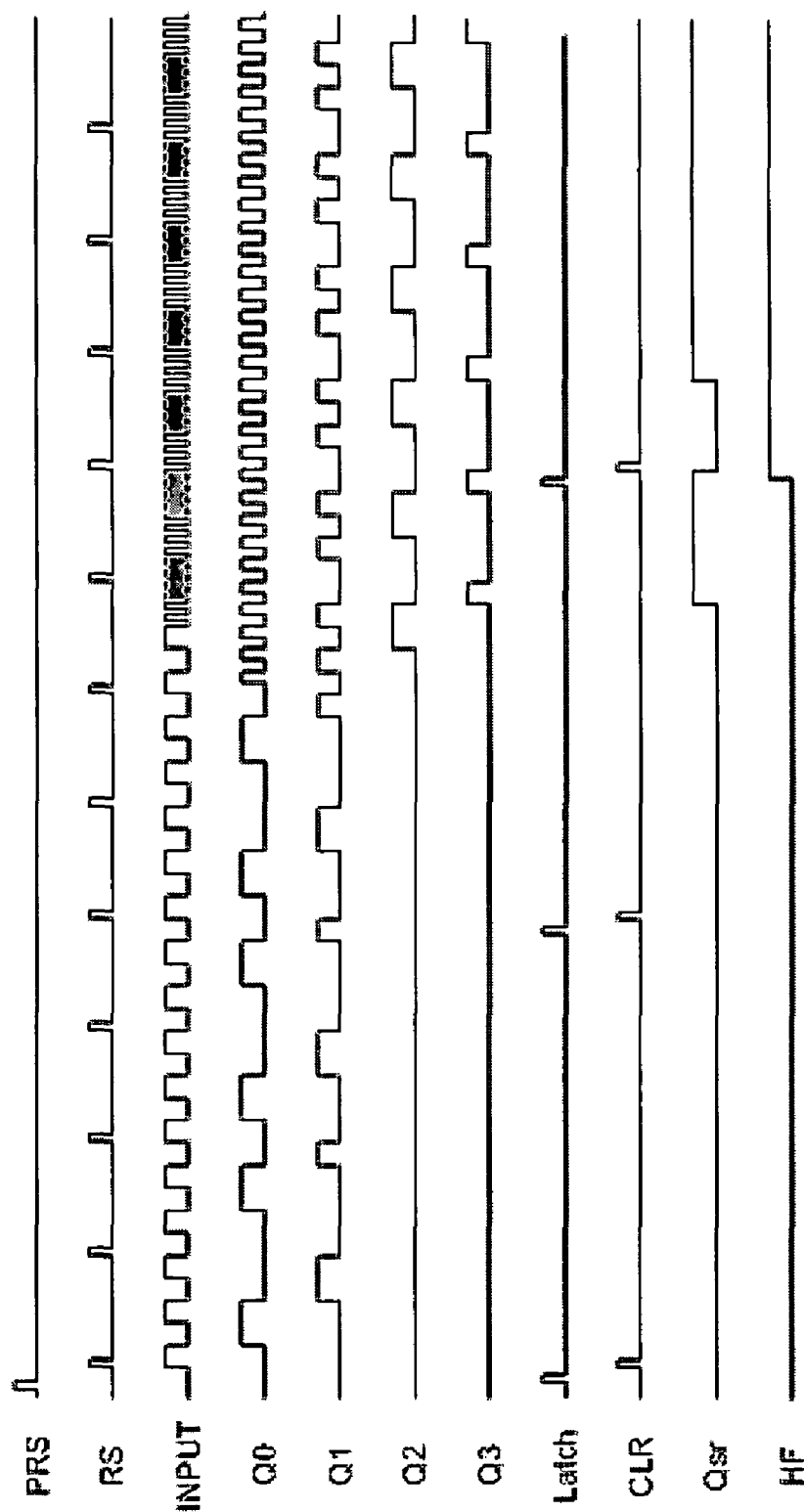
FIG. 6 is a view of the actual operation of frequency detection circuit of the present invention.

Referring then to FIG. 5, which is a view of an embodiment of the frequency detection circuit 130 of the present invention. As shown in FIG. 5, the frequency detection circuit 130 includes four divide-by-2 frequency dividers, a D type flip-flop, and a SR latch circuit. In the present embodiment, the frequency dividers and the D type flip flop are all falling edge triggered. PRS, Latch, CLR and Reset as shown in FIG. 5 are all signals transmitted by the control circuit 110. INPUT is the signal that is under testing. When the input signal is detected to be a high frequency signal, the HF signal will change to High, and the actual operation of the frequency detection circuit 130 is as shown in FIG. 6. When the testing device is turned on, the control circuit 110 will first send a PRS reset signal; meantime, the HF and Qsr signals will be reset as Low. Before each test starts, the control circuit 110 will first send a Latch signal to store the status of Qsr, and then send a CLR signal to reset Qsr as Low; on the other hand, the control circuit 110 will keep sending RS signal to reset the Q0~Q3 as Low.

In FIG. 6, when the input signal is a low frequency signal, Q3 remains Low; and when the input signal is a high frequency signal, Q3 is triggered to be High by Q2, and Qsr is set to be High and the HF signal is triggered to be High by the Latch signal and the switches SW1 and SW2 are switched to S1 position and the low-pass filter 140 is turned off. Thus the unattenuated signal is chosen to be tested, and the accuracy of the testing and the safety during usage can thus be enhanced.

It should be noted again that, in the embodiment of the present invention, when the frequency detection circuit 130 detects the input testing signal as a high frequency signal, the frequency detection circuit will output a signal indicating HF as High to the switches SW1 and SW2. At this moment, the switches SW1 and SW2 are switched to the S1 position, and the low-pass filter 140 is turned off to avoid receiving the attenuated signal. The accuracy of the testing and the safety during usage can thus be greatly enhanced.

And when the frequency of the input testing signal is between low frequency and high frequency, i.e. the frequency of the input signal evaluated by the frequency evaluation circuit 120 as higher than ωM, the frequency evaluation circuit will output a signal indicating MF as High to the switches SW3 and SW4 as shown in FIG. 3, and the two switches are switched to S1 position for the −3 db frequency outputted by the low-pass filter 140 to be changed to ω1. The −3 db frequency outputted by the low-pass filter 140 is able to be changed since the resistors are switched to R3 and R4 by the two switches SW3/SW4 and resistor value of R3 and R4 are smaller than that of the resistors R1 and R2. According to the principle of design as described above, when the testing frequency is more precisely divided into more regions between the low frequency and the high frequency, the two switches (SW3, SW4) can be changed to be multiple levels switches (such as S0-S15); meantime, the connecting point of each of the switches S0-S15 connects to a resistor with different resistor value. Thus the circuit of low-pass filter 140 of the present invention can switch to different frequency according to the frequency of testing signal, which further enhances the accuracy of testing and the safety during usage.

Although specific embodiments have been illustrated and described, it will be appreciated by those skilled in the art that various modifications may be made without departing from the scope of the present invention, which is intended to be limited solely by the appended claims. in the present invention can output different frequencies according to the frequency of the testing signal. The accuracy of the testing and the safety of the using can be enhanced.

What is claimed is:

1. A testing device including a low-pass filter with an automatically switching function, comprising:

a control circuit for controlling operation of said testing device and providing a reference frequency;

a frequency detection circuit connecting to an input end and said control circuit and outputting a high frequency control signal;

a low-pass filter filtering a testing signal from said input end and outputting a frequency signal, said low-pass filter being electrically connected to said frequency detection circuit;

a frequency evaluation circuit connecting to said control circuit and said low-pass filter, said frequency evaluation circuit outputting a medium frequency control signal to said low-pass filter and outputting a frequency testing value to a display; and a voltage measuring circuit connecting to said low-pass filter and said control circuit and outputting a voltage measuring value to said display.

2. The testing device according to claim 1, wherein said frequency detection circuit comprises a plurality of frequency dividers in series connection, a flip-flop, and a SR latch.

3. The testing device according to claim 2, wherein said plurality of frequency dividers are divide-by-2 frequency dividers.

4. The testing device according to claim 2, wherein said flip-flop is a D type flip-flop.

5. The testing device according to claim 2, wherein said frequency dividers are falling edge triggered.

6. The testing device according to claim 2, wherein said flip-flop is falling edge triggered.

* * * * *